US007321661B2

(12) United States Patent
Stanley

(10) Patent No.: US 7,321,661 B2
(45) Date of Patent: Jan. 22, 2008

(54) CURRENT FEEDBACK SYSTEM FOR IMPROVING CROSSOVER FREQUENCY RESPONSE

(75) Inventor: Gerald R. Stanley, Osccola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 315 days.

(21) Appl. No.: 10/697,626

(22) Filed: Oct. 30, 2003

(65) Prior Publication Data

US 2005/0094830 A1 May 5, 2005

(51) Int. Cl.
*H04R 3/00* (2006.01)
*H03G 5/00* (2006.01)
*H03F 21/00* (2006.01)

(52) U.S. Cl. .......................... 381/111; 381/98; 381/99; 381/120; 381/116

(58) Field of Classification Search ................ 381/111, 381/120, 99, 98, 116, 96, 59
See application file for complete search history.

(56) References Cited

U.S. PATENT DOCUMENTS 4,335,274 A * 6/1982 Ayers .......................... 381/96
4,504,704 A * 3/1985 Ohyaba et al. ............. 381/332
4,670,709 A * 6/1987 Iredale ....................... 324/542
4,751,738 A * 6/1988 Widrow et al. ............. 381/313
5,097,223 A * 3/1992 Alexander .................. 330/126
5,533,135 A * 7/1996 Gary ........................... 381/99
5,598,480 A * 1/1997 Kim ............................ 381/99
6,297,975 B1 10/2001 Stanley
6,381,334 B1 * 4/2002 Alexander ................... 381/99
6,661,290 B2 * 12/2003 Sugiura ...................... 330/289
2002/0097097 A1 * 7/2002 Sugiura ...................... 330/295
2004/0101153 A1 * 5/2004 Grudin et al. ............. 381/357

OTHER PUBLICATIONS

Sedra/Smith. Microelectronic Circuits. Oxford University Press, 1998. New Youk, pp. 668-671, Figure 8.1.*
Sedra/Smith. Microelectronic Circuits. Oxford University Press, 1998. New York, pp. 668-671, Figure 8.1.*
Sedra, Smith. Microelectronic Circuits. Oxford University Press, 1998. New York, pp. 668-671, Figure 8.1.*
Alexander, Mark. The Alexander Current Feedback Audio Power Amplifier. Analog Devices. 1990.*

(Continued)

*Primary Examiner*—Vivian Chin
*Assistant Examiner*—Devona E. Faulk
(74) *Attorney, Agent, or Firm*—Brinks Hofer Gilson & Lione

(57) ABSTRACT

A loudspeaker is provided for receiving an incoming electrical signal and transmitting an acoustical signal. The loudspeaker may include a power amplifier that has an input and an output, where the input receives the incoming electrical signal. The loudspeaker may also include two or more passive filters, such as low-pass, band-pass, and/or high-pass filters, which are coupled to the output of the power amplifier. The passive filters may also be coupled to one or more speaker drivers. The arrangement of passive filters and speaker drivers may have a single input that has a combined input impedance. The output of the amplifier may have an output impedance. The output impedance may be between about 25% and about 400% of the combined input impedance. The power amplifier may include a current-feedback amplifier that is configured to maintain the desired output impedance.

43 Claims, 10 Drawing Sheets

OTHER PUBLICATIONS

Current Feedback Amplifier Theory and Applications. Intersil Corporation 1999.*

Richard E. Werner, "Loudspeaker Resonance: Comments on a Paper by Trautman," *Journal of the Audio Engineering Society*, Letters to the Editor.

Hermon H. Scott, "Power Amplifiers for Music Reproduction," *Journal of the Audio Engineering Society*, Jul. 1955, vol. 2, No. 3.

Charles A. Wilkins, "Control of Amplifier Source Resistance," *Journal of the Audio Engineering Society*, Jan. 1956, vol. 4, No. 1.

R.E. Werner and R.M. Carell, "Application of Negative Impedance Amplifiers to Loudspeaker Systems", Preprinted manuscript as presented at the 9th Annual Meeting of the Audio Engineering Society, Oct. 8-12, 1957.

R.E. Werner and R.M. Carrell, "Application of Negative Impedance Amplifiers to Loudspeaker Systems", *Journal of the Audio Engineering Society*, Oct. 1958, vol. 6, No. 4.

Richard E. Werner, "Comments on 'Recent Cone Speaker Development'" *Journal of the Audio Engineering Society*, Letters to the Editor, Jan.1960, vol. 8, No. 7.

Joel H. Levitt, "Impedance Tailoring Via Feedback," Preprinted manuscript as presented at the 49th Convention of the Audio Engineering Society, Sep. 9-12, 1974.

Crown International Inc. "Delta Omega 2000 Power Amplifier", *Crown International Inc. Brochure*, 1983.

* cited by examiner

CURRENT FEEDBACK SYSTEM FOR IMPROVING CROSSOVER FREQUENCY RESPONSE

FIELD OF THE INVENTION

This invention relates generally to a loudspeaker system, and more particularly to a loudspeaker system having an amplifier, post-amplifier passive filters, and multiple speaker drivers.

BACKGROUND OF THE INVENTION

It may be difficult to produce a speaker driver that accurately reproduces the 20 Hz to 20 kHz frequency range (audible spectrum) of sound generally associated with human hearing. Therefore, speaker drivers have been produced that accurately reproduce a more limited range. These limited-range speaker drivers may be used in conjunction with one another to more accurately reproduce the full range of sound. For example, a full range loudspeaker system may include a low frequency speaker driver, a midrange frequency speaker driver, and a high frequency speaker driver.

Loudspeaker systems having two or more limited-range speaker drivers are known as "multi-way" loudspeaker systems. For example, a loudspeaker system having a low-frequency speaker driver and a high-frequency speaker driver is known as a "two-way" loudspeaker system. A loudspeaker system additionally having a mid-frequency speaker driver is known as a "three-way" loudspeaker system, and so on.

Because a limited-range speaker driver is designed to handle a particular range of frequencies, it may be desirable to filter frequencies outside of this particular range from the electrical signal driving the limited-range speaker driver. For example, a two-way loudspeaker system may include a low-pass filter and a high-pass filter. A three-way loudspeaker system may include a low-pass filter, a band-pass filter, and a high-pass filter. Multi-way loudspeaker systems having more than four different limited-range speaker drivers (four-way, five-way, etc.) may include multiple band-pass filters in addition to a low-pass filter and a high-pass filter.

Frequencies that are dividing points in a frequency range are known as crossover frequencies. For example, a two-way system may have one crossover frequency, so that frequencies above the crossover frequency are reproduced by a high-frequency speaker driver and frequencies below the crossover frequency are reproduced by a low-frequency speaker driver. Likewise, in a three-way loudspeaker system, it may be desirable to select two crossover frequencies, so that signals below the first crossover frequency drive the low-range speaker driver, signals above the first crossover frequency but below the second crossover frequency are sent to the mid-range speaker driver, and signals above the second crossover frequency drive the high-range speaker driver. Low-pass, band-pass, and high-pass filters used to filter signals for a multi-way loudspeaker system in this manner are known as crossover filters.

Crossover filters can be placed in a signal path between a signal source, such as a microphone, tape deck, compact disc player, or the like, and power amplifiers that provide power to a multi-way loudspeaker system. In such an arrangement, each power amplifier receives signals in a certain frequency range, and drives limited-range speaker drivers that operate in that frequency range. Alternatively, crossover filters can be placed in a signal path between a power amplifier and limited-range speaker drivers of a multi-way loudspeaker system. In the latter case, the crossover filters may be passive inductor-capacitor (LC) networks. The advantage of a post-amplifier crossover arrangement may be a reduced number of amplifiers in the sound system.

In a multi-way loudspeaker system using a post-amplifier crossover arrangement, it may be desirable to design crossover filters that achieve a flat response throughout a frequency range. To achieve a flat frequency response in a post-amplifier crossover arrangement, a crossover filter may be designed based on an impedance of a limited-range speaker driver that will operate with the crossover filter. For example a passive LC second order low-pass filter has all of its inductor (L) and capacitor (C) values chosen based upon the driver's impedance, say 4 Ohms. If the driver's impedance were to double and the crossover were to remain correctly tuned, the inductors would need to double in value and the capacitors would need to halve in value.

When a multi-way loudspeaker system using a post-amplifier passive crossover arrangement is operated at high levels for a period of time, the tonal quality of the loudspeaker system may become altered. It has been discovered that this alteration in response is due to changes in the impedances of speaker drivers in a multi-way loudspeaker system as the coils in the speaker drivers become hot. These changes in impedances may cause "bumps" in the frequency response of the multi-way loudspeaker systems, because the crossover filters are usually designed to operate with the "cold" impedances of the speaker drivers and may not be able to adjust inductance (L) and capacitance (C) values to compensate for the higher driver impedances. It would be desirable to provide a sound system that compensates for changes in speaker drivers' impedances in a multi-way loudspeaker system using a post-amplifier crossover arrangement.

SUMMARY

A loudspeaker is provided for receiving an incoming electrical signal and transmitting an acoustical signal. The loudspeaker may include a power amplifier that receives the incoming electrical signal and provides a power signal to two or more passive filters, such as low-pass, band-pass, or high-pass filters, which are coupled to the output of the power amplifier. The passive filters may be coupled to one or more speaker drivers so that the arrangement of passive filters and speaker drivers has a single input with a single combined input impedance. The amplifier may have an output impedance between about 25% and about 400% of the combined input impedance of the arrangement of passive filters and speaker drivers. The power amplifier may include a current-feedback amplifier that is configured to maintain the desired impedance at the output.

Alternatively, the power amplifier may include a voltage-source amplifier and a "ballast" resistor in series with the output of the voltage-source amplifier. In this arrangement, the resistance of the ballast resistor may be between about 25% and about 400% of the combined input impedance of the arrangement of passive filters and speaker drivers.

When the power amplifier has an output impedance that is between a quarter and four times the impedance of the combined input impedance of the arrangement of passive filters and speaker drivers, impedance changes in the one or more speaker drivers may not affect the loudspeaker's frequency response as significantly as when the power amplifier has either an output impedance near zero (voltage source) or near infinity (current source).

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE FIGURES

The invention can be better understood with reference to the following figures. The components in the figures are not necessarily to scale; emphasis is instead being placed upon illustrating the principles of the invention. Moreover, in the figures, like reference numerals designate corresponding parts throughout the different views.

DETAILED DESCRIPTION OF THE PREFERRED EMBODIMENTS

Figure 1:
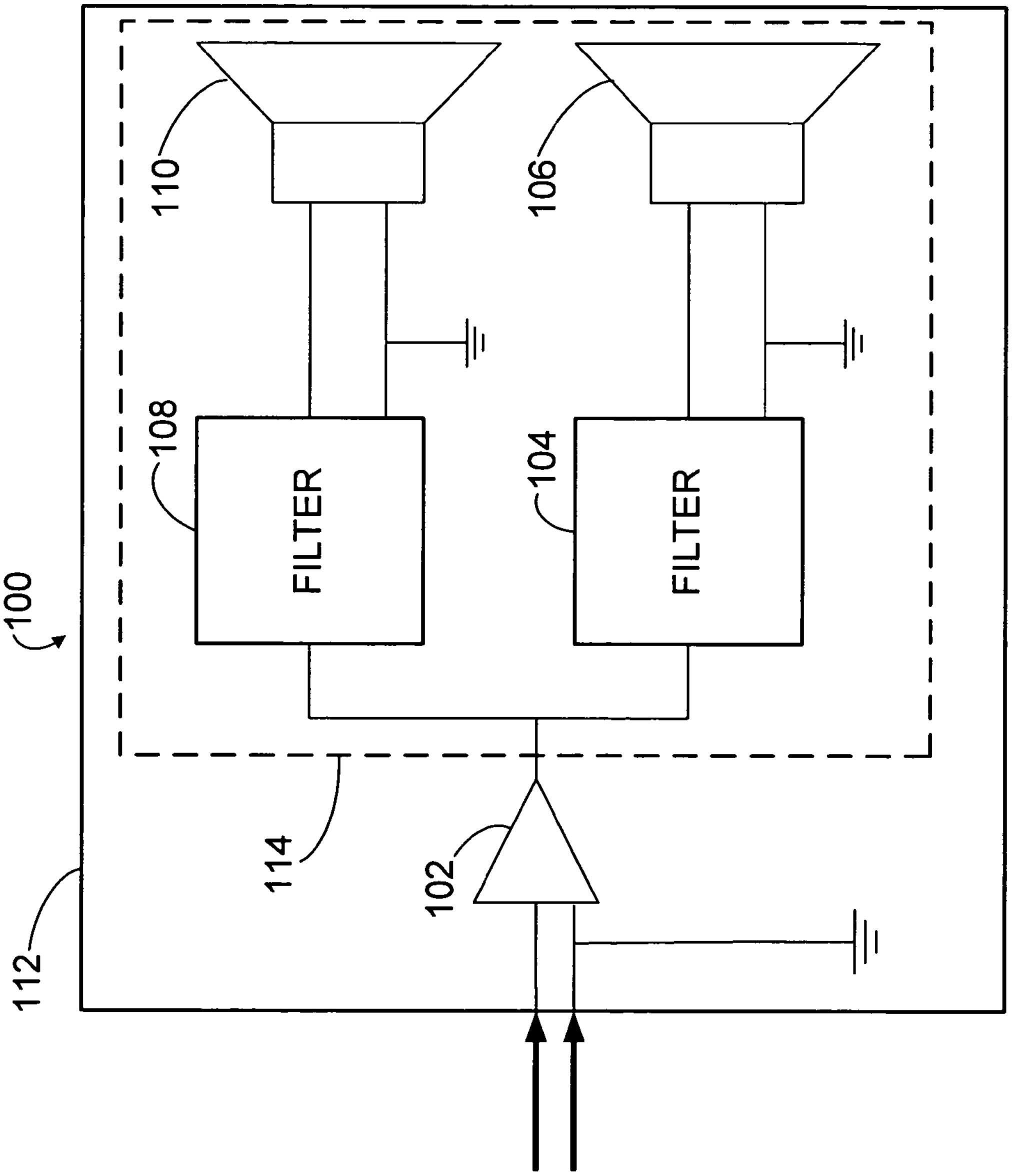
FIG. 1 is a loudspeaker system.

FIG. 1 is a loudspeaker system 100. The loudspeaker system 100 may include a power amplifier 102, a first filter 104, a second filter 108, a first speaker driver 106 and a second speaker driver 110. The loudspeaker system 100 may also include an enclosure 112 for housing the power amplifier 102, the filters 104 and 108, and the speaker drivers 106 and 110. The first and second filters 104 and 108, and the first and second speaker drivers 106 and 110 collectively comprise a driver circuit 114. The driver circuit 114 has an input impedance.

The speaker drivers 106 and 110 may each be either a wide-range speaker driver or a limited-range speaker driver, and may cover complimentary parts of the audible spectrum. The speaker drivers 106 and 110 may have coils (not shown) with respective impedances of $Z_A$ and $Z_B$ that may vary with, for example, coil frequency or temperature. The filters 104 and 108 may each be a high-pass, band-pass, or low-pass filter, and may be passive inductor-capacitor filters.

Figure 2:
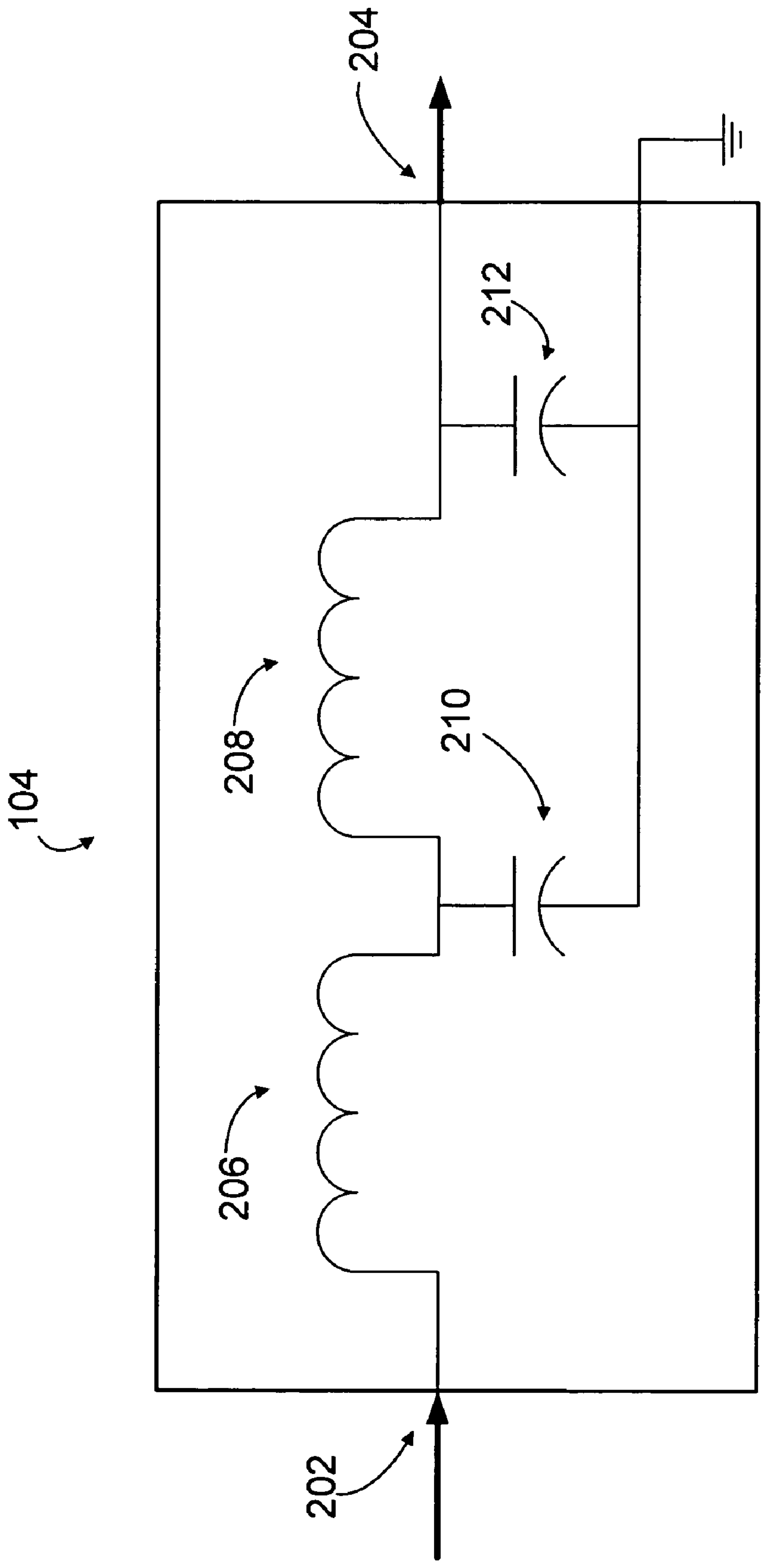
FIG. 2 is a schematic for a first example passive filter for the loudspeaker system of FIG. 1.
Figure 3:
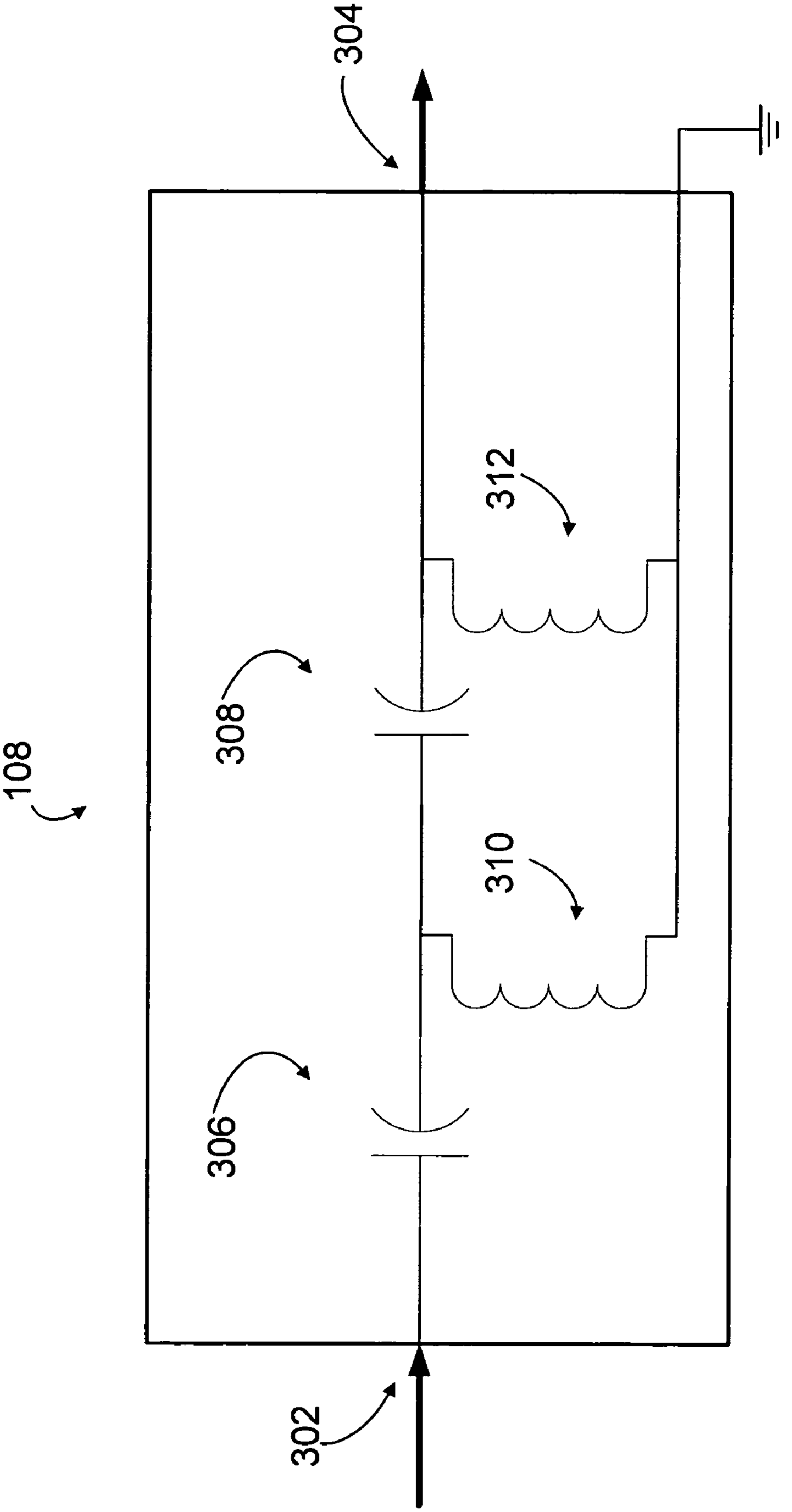
FIG. 3 is a schematic for a second example passive filter for the loudspeaker system of FIG. 1.
Figure 4:
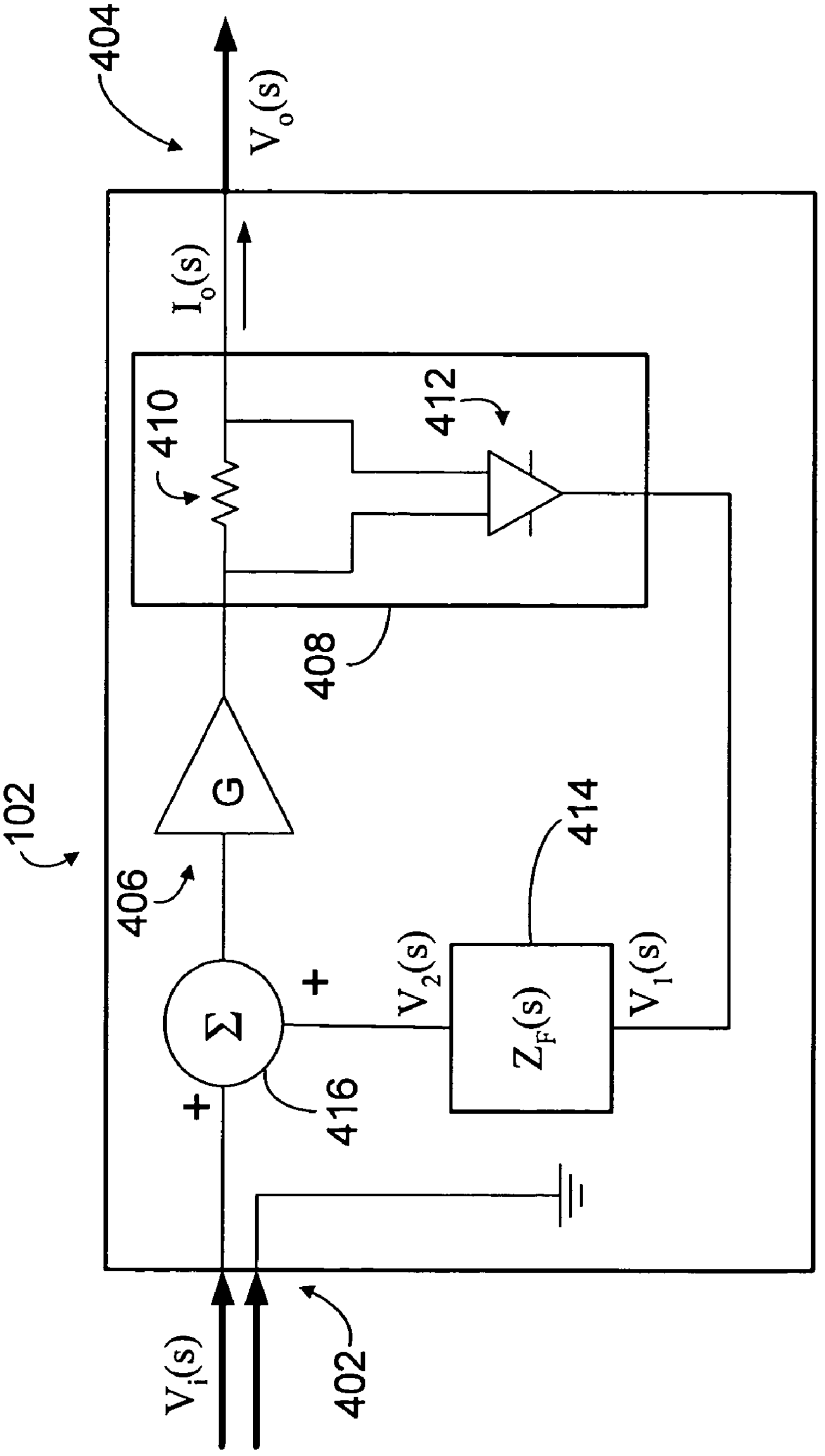
FIG. 4 is a schematic for an example current-feedback amplifier for the loudspeaker system of FIG. 1.

For example, the first filter 104 may include a fourth-order Butterworth low-pass filter, as shown in FIG. 2. The second filter 108 may include a fourth-order Butterworth high-pass filter, as shown in FIG. 3. The first and second filters 104 and 108 may also include other types of filters, such as a Chebyshev filters, elliptic filters, or the like, and may also be of other orders. Details for example filters 104 and 108 shown in FIGS. 2 and 3 are described in greater detail below. The power amplifier 102 may include a current-feedback amplifier with an output impedance, as shown in FIG. 4 and described below.

As shown in FIG. 2, an example of the first filter 104 may be a fourth-order Butterworth low-pass filter. A Butterworth filter is an all-pole filter having a maximally flat frequency response in a pass-band. Butterworth filters can be derived in various orders where an order is equal to the number of poles of attenuation at infinity for a low-pass filter or the number of poles of attenuation at zero for a high-pass filter. The first filter 104 could also be another type of filter and/or a filter of another order.

The first filter 104 may include an input 202 and an output 204. The input 202 may have an input impedance (as seen from the power amplifier 102 (FIG. 1)) that is about equal to the impedance of the first filter 104 and the first speaker driver 106 (FIG. 1), which is coupled to the output 204. The first filter 104 may receive an input signal from the power amplifier 102 at the input 202 and produce a filtered output signal at the output 204. The illustrated first filter 104 may include a first inductor 206, a second inductor 208, a first capacitor 210 and a second capacitor 212. A desired cutoff frequency $f_c$ in Hertz (the "−3 dB point") for the first filter 104 has a value in radians of $\omega_c$ where:

$$\omega_c=2*\pi*f_c \tag{1}$$

The inductor 206 may have an inductance of L1, the second inductor 208 may have an inductance of L2, the first capacitor 210 may have a capacitance of C1, and the second capacitor 212 may have a capacitance of C2. Where the first filter 104 is designed to have a zero Ohm input characteristic termination impedance at input 202, and an output characteristic termination impedance of $R_{F1}$ at output 204, values for L1, L2, C1 and C2 may be determined as follows:

$$L1=(1.531*R_{F1})/\omega_c \tag{2}$$

$$C1=1.577/(R_{F1}*\omega_c) \tag{3}$$

$$L2=(1.082*R_{F1})/\omega_c \tag{4}$$

$$C2=0.383/(R_{F1}*\omega_c) \tag{5}$$

The equations (2)-(5) are equations for calculating component values for a fourth-order Butterworth filter. In other example filters, the components and equations for calculating the component values may be different. The first filter 104 may provide a filtered output signal to the speaker driver 106. The speaker driver 106 may have a "cold" impedance $Z_A$ of $R_{F1}$, so that in this example the impedance of the first filter 104 is chosen to match the cold impedance of the first speaker driver 106.

Turning to FIG. 3, an example of the second filter 108 may be a fourth-order Butterworth high-pass filter. The second filter 108 may include a first capacitor 306, a second capacitor 308, a first inductor 310, and a second inductor 312. The first capacitor 306 may have a capacitance of C1 and the second capacitor 308 may have a capacitance of C2. The first inductor 310 may have an inductance of L1 and the second inductor 312 may have an inductance of L2. For a desired cutoff frequency $f_c$ in Hertz, a frequency value in radians of $\omega_c$ may be calculated according to equation (1).

Where the second filter 108 is designed to have a zero Ohm input characteristic termination impedance at input 302, and an output characteristic termination impedance of $R_{F2}$ at output 304, values for C1, C2, L1 and L2 may be determined as follows:

$$C1=0.653/(R_{F2}*\omega_c) \quad (6)$$

$$L1=0.634*R_{F2}/\omega_c \quad (7)$$

$$C2=0.924/(R_{F2}*\omega_c) \quad (8)$$

$$L2=2.613*R_{F2}/\omega_c \quad (9)$$

The equations (6)-(9) are equations for calculating component values for a fourth-order high-pass Butterworth filter. The second filter 108 may provide a filtered output signal to the second speaker driver 110. The second speaker driver 110 may have a cold impedance $Z_B$ of $R_{F2}$, so that in this example the impedance of the second filter 108 is chosen to match the cold impedance of the second speaker driver 110.

As mentioned above, the loudspeaker system 100 may exhibit a degradation in tonal quality if the coils of the speaker drivers 106 and 110 become hot, and the impedances of the coils change. In laboratory experiments, impedances of speaker drivers were observed to increase by as much as 100%. For example, a speaker driver having a cold impedance of 4 Ohms may have an impedance of 8 Ohms when the coil is hot. Such heating may occur, for example, in professional sound reinforcement applications, where power amplifiers frequently produce more than a kilowatt of continuous power. The effect of speaker driver impedance changes on frequency response is described in detail below.

Figure 5:
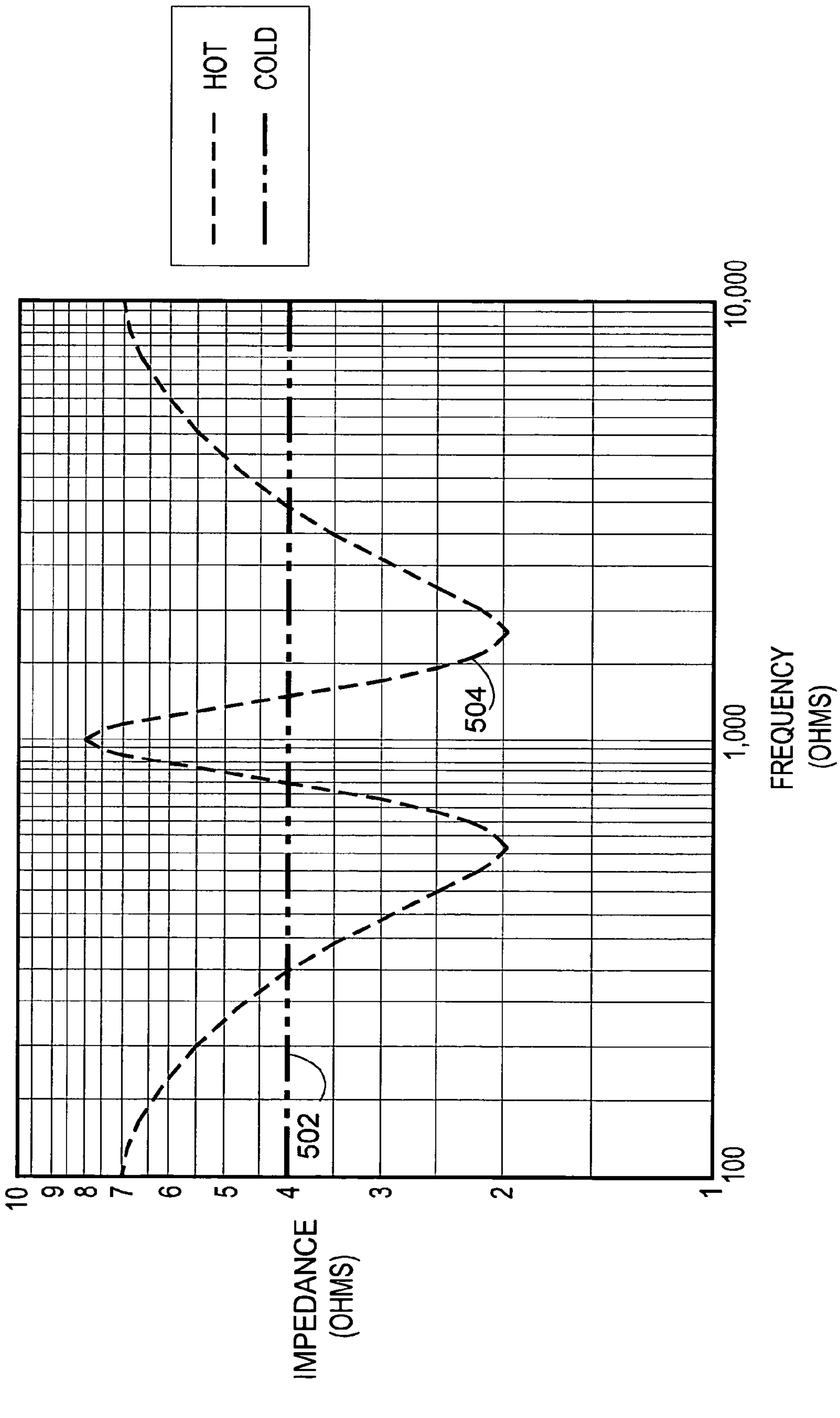
FIG. 5 is a graph of combined hot and cold input impedances versus frequency for the example loudspeaker system of FIG. 1.

FIG. 5 is an input impedance versus frequency graph for the example driver circuit 114 shown in FIGS. 1-3. The graph of FIG. 5 compares hot and cold input impedances for the driver circuit 114. For the driver circuit 114, the first filter 104 is a fourth-order Butterworth low-pass filter having a cutoff frequency $f_c$ of 1,000 Hz, and the second filter 108 is a fourth-order Butterworth high-pass filter, also having a cutoff frequency $f_c$ of 1,000 Hz. The filters 104 and 108 are each designed to have a zero Ohm input characteristic termination impedance and an output characteristic termination impedance of 4 Ohms.

In this example, the cold and hot impedances of each speaker driver 106 and 110 are 4 Ohms and 8 Ohms, respectively. For cases where the speaker drivers 106 and 110 are heated to a lesser degree, the impedance increase may be less. The solutions disclosed for correcting tonal quality problems caused by impedance increases work equally well over a wide range of impedance increases, and the use of a 4 Ohm increase in this example should not be considered a limitation. As can be seen in FIG. 5, when the speaker drivers 106 and 110 are hot, the input impedance of the driver circuit 114 varies from a high of 8 Ohms at the cutoff frequency $f_c$ to a low of 2 Ohms on either side of the cutoff frequency $f_c$.

Figure 6:
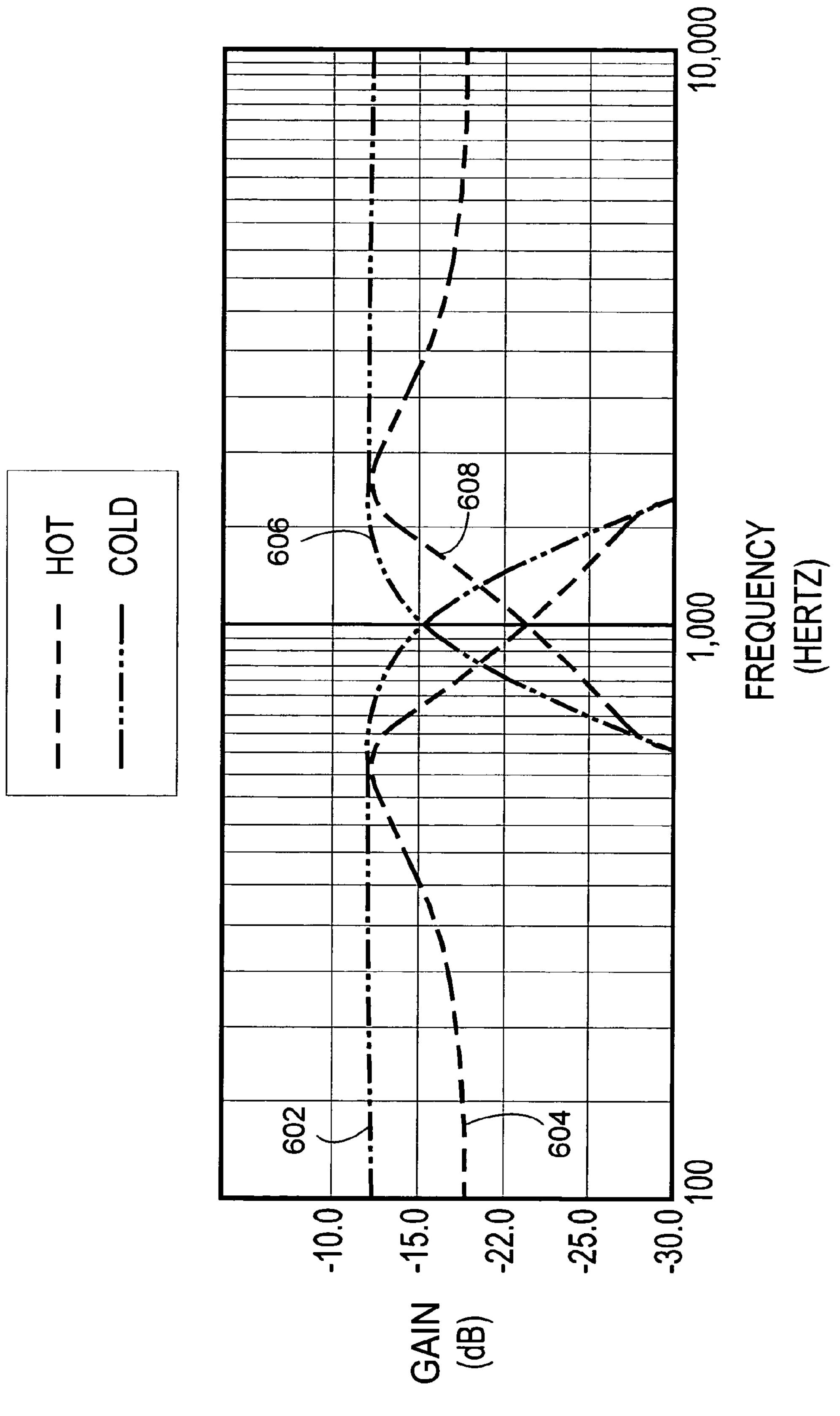
FIG. 6 is a frequency response graph for speaker drivers of the example loudspeaker system of FIG. 1 using an example "voltage source" amplifier.

Many commercially available power amplifiers are "voltage source" amplifiers that have an output impedance that is near zero Ohms. A voltage source power amplifier 102 may have an output impedance of, for example, 5 milli-Ohms. FIG. 6 is a current excitation frequency response graph for the speaker drivers 106 and 110 where a voltage source amplifier is connected to the driver circuit 114. FIG. 6 compares the frequency responses when the speaker drivers 106 and 110 are cold to the frequency responses when the speaker drivers 106 and 110 are hot.

Plot lines 602 and 604 show the magnitudes of currents that flow through the first speaker driver 106 and plot lines 606 and 608 show the magnitudes of currents that flow through the second speaker driver 110. The intrinsic forcing function of a speaker driver is directly related to currents (Lorentz force) flowing through the speaker driver's coil, not voltages across the coil. For example, when the coil's impedance increases, but voltage driving the coil does not, there will be an attendant gain compression as a consequence of a reduction in the voice coil's current. Therefore, the gains of interest for determining how the loudspeaker system 100 "sounds" are current gains for the coils of the speaker drivers 106 and 110.

As can be seen in FIG. 6, when the coils of the speaker drivers 106 and 110 are cold, the frequency response is a maximally-flat response, where the cutoff frequency $f_c$ (−3 dB point) for each of the filters 104 and 110 is 1,000 Hz. When the coils of the speaker drivers 106 and 110 are hot, however, the frequency response for each of the filters 104 and 110 has an undesirable "bump" of almost 6 dB near the cutoff frequency. Additionally, the first example filter 104 has a cutoff frequency $f_c$ that is significantly below the desired cutoff frequency of 1,000 Hz, while the second example filter 108 has a cutoff frequency $f_c$ that is significantly above the desired cutoff frequency of 1,000 Hz. As the coils of speaker drivers 106 and 110 heat and cool, resulting in impedance variations, the frequency response for the loudspeaker system 100 will correspondingly vary between the hot and cold plots shown in FIG. 6, causing dynamic changes in tonal quality.

Figure 7:
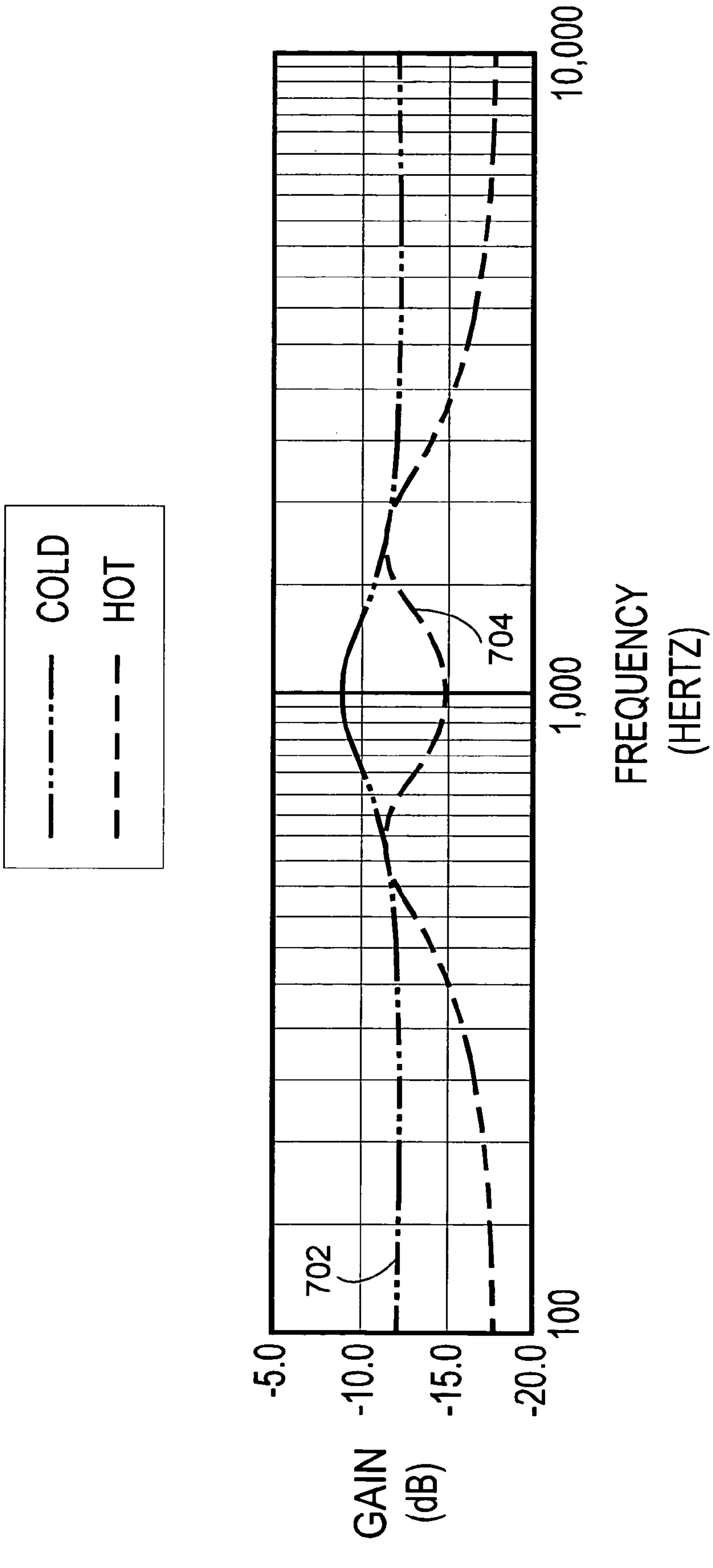
FIG. 7 is a combined frequency response graph for speaker drivers of the example loudspeaker system of FIG. 1 using an example "voltage source" amplifier.

FIG. 7 is a frequency response graph where a voltage source amplifier is used with the driver circuit 114. Essentially, FIG. 7 includes one "hot plot" 704 that is equal to the vector sum of the two "hot plots" 604 and 608 from FIG. 6, and one "cold plot" 702 that is equal to the vector sum of the two "cold plots" 602 and 606 from FIG. 6. As used herein, the terms "hot plot" and "hot frequency response" refer to a plot of a frequency response of the loudspeaker system 100 as a whole and/or plots of frequency responses of the speaker drivers 106 and 110, when the coils of the speaker drivers 106 and 110 are each hot and each have an impedance of 8 Ohms. Likewise, the terms "cold plot" and "cold frequency response" refer to a plot of a frequency response of the loudspeaker system 100 as a whole and/or plots of frequency responses of the speaker drivers 106 and 110, when the coils of the speaker drivers 106 and 110 are each cold and each have an impedance of 4 Ohms.

FIG. 7 shows more clearly the severity of the distortion from the cold frequency response when the coils of the speaker drivers 106 and 110 become hot. As can be seen in FIG. 7, the cold plot 702 has about a 3 dB "bump" at the cutoff frequency of 1,000 Hz, which is a natural feature for a fourth order filter that results from phasing the filters 104 and 110 to produce in-phase signals at the cutoff frequency. The hot plot, however, has about a 3 dB dip at the cutoff frequency, which is further complicated by the "bumps" on either side of the cutoff frequency.

Figure 8:
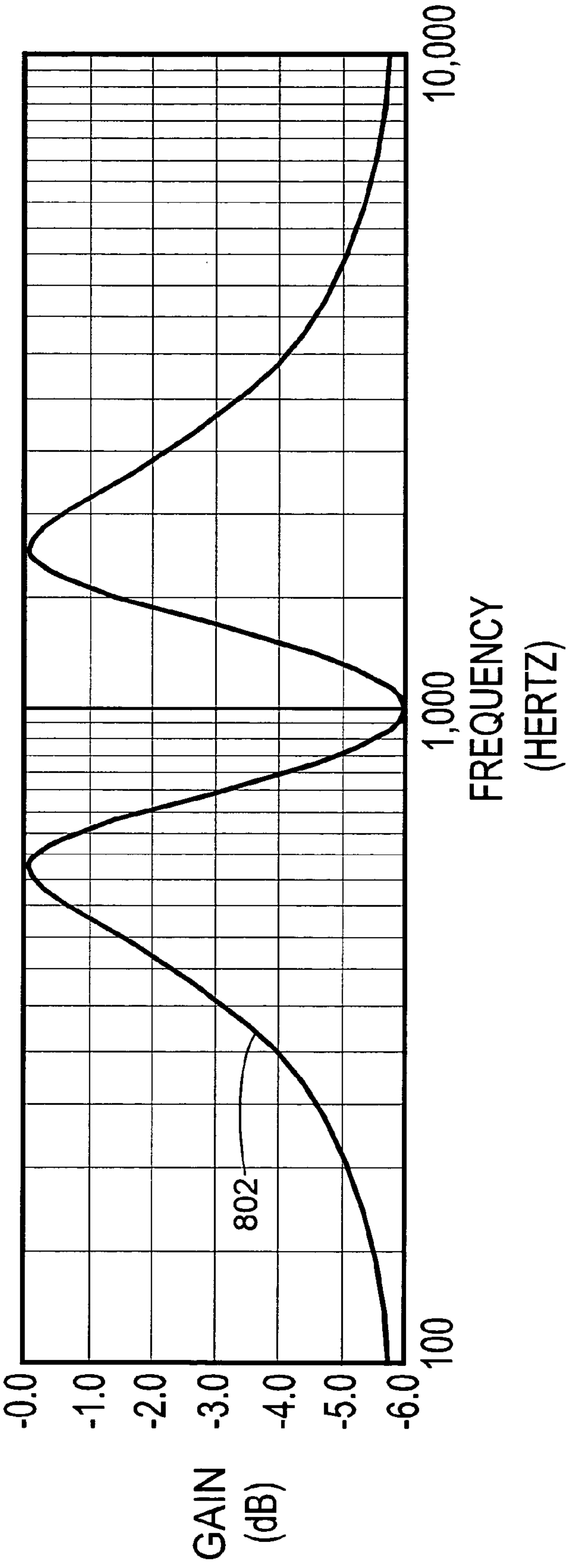
FIG. 8 is a "frequency response change" graph for speaker drivers of the example loudspeaker system of FIG. 1 using an example "voltage source" amplifier.

The loudspeaker system 100 lessens frequency response variations, such as those shown in FIGS. 6 & 7, which result from temperature changes in the coils of the speaker drivers 106 and 110. The desired result is a hot frequency response that is relatively flat compared to a cold frequency response. To better illustrate the problem of frequency response fluctuation, FIG. 8 shows a plot of a "frequency response change" plot 802 that is equal to the hot frequency response plot 704 from FIG. 7 divided by the cold frequency response plot 702 from FIG. 7. Ideally, the frequency response change plot 802 would be a horizontal line at all frequencies, indicating that the hot response 704 is flat with respect to the cold response 702. As shown in FIG. 8, the relative frequency response plot 802, where a voltage source amplifier is used with the driver circuit 114, is not ideal.

The frequency response variations shown in FIG. 8 that result from temperature changes in the coils of the speaker drivers 106 and 110 may be lessened by using the current-feedback power amplifier 102, an example of which is shown in FIG. 4 and described below, instead of a voltage source power amplifier. In particular, the output impedance $Z_o(s)$ of the amplifier 102 may be designed to be about equal to the input impedance of the driver circuit 114. Alternatively, the output impedance $Z_o(s)$ of the amplifier 102 may be designed to be more or less than the input impedance of the driver circuit 114, but significantly more than zero and significantly less than infinite.

Alternatively, the frequency response variations may be lessened by using a voltage-source amplifier and a "ballast" resistor having an impedance about equal to the input impedance of the driver circuit 114, where the ballast resistor is coupled in series with the output of the voltage-source amplifier. Such a ballast resistor, however, may dissipate approximately half of the output power of the amplifier. The current-feedback power amplifier 102, on the other hand, may provide the desired output impedance with almost no power loss.

As shown in FIG. 4, an example current-feedback power amplifier 102 may have an input 402 and an output 404. The output 404 may have an output impedance. The power amplifier 102 may operate in the frequency (s) domain as follows. The power amplifier 102 may receive an input electrical signal $V_i(s)$ at input 402 and generate an output electrical signal $V_o(s)$ at output 404. The power amplifier 102 may include an amplifier 406 having a gain (G), and a current monitor 408. The current monitor 408 may include a current sensing resistor 410 of value $R_s$ and a difference amplifier 412 having a gain constant $K_A$. The result is a voltage signal $V_1(s)$ generated by the current monitor 408 which stated as an equation is:

$$V_1(s)=I_o(s)*R_s*K_A \quad (10)$$

The power amplifier 102 may also include a summer 416 and a feedback circuit 414. The feedback circuit 414 may have a transfer ratio of $Z_F(s)$ and generate a feedback signal $V_2(s)$. Therefore, the transfer ratio of $Z_F(s)$ of the feedback circuit 414 may be:

$$Z_F(s)=V_2(s)/V_1(s) \quad (11)$$

The summer 416 may receive the input signal $V_i(s)$ and sum it with the feedback signal $V_2(s)$ from the feedback circuit 414. Therefore, the output signal $V_o(s)$ may be represented as:

$$V_o(s)=[G*V_i(s)]+[G*I_o(s)*R_s*K_A*Z_F(s)] \quad (12)$$

Because impedance is equal to voltage divided by current, the output 404 may have an output impedance of $Z_o(s)$ that can be expressed as:

$$Z_o(s)=V_o(s)/I_o(s) \quad (13)$$

Solving equations (10) through (13) for $V_i(s)=0$, $Z_o(s)$ may be also be expressed as:

$$Z_o(s)=G*R_s*K_A*Z_F(s) \quad (14)$$

As shown by equation (14), the power amplifier 102 may be designed to have a desired output impedance $Z_o(s)$ by choosing a feedback circuit 414 having a transfer ratio of like form. The product $G*R_s*K_A$ may be approximately unity, in which case the output impedance $Z_o(s)$ is equal to the transfer ratio $Z_F(s)$.

Figure 9:
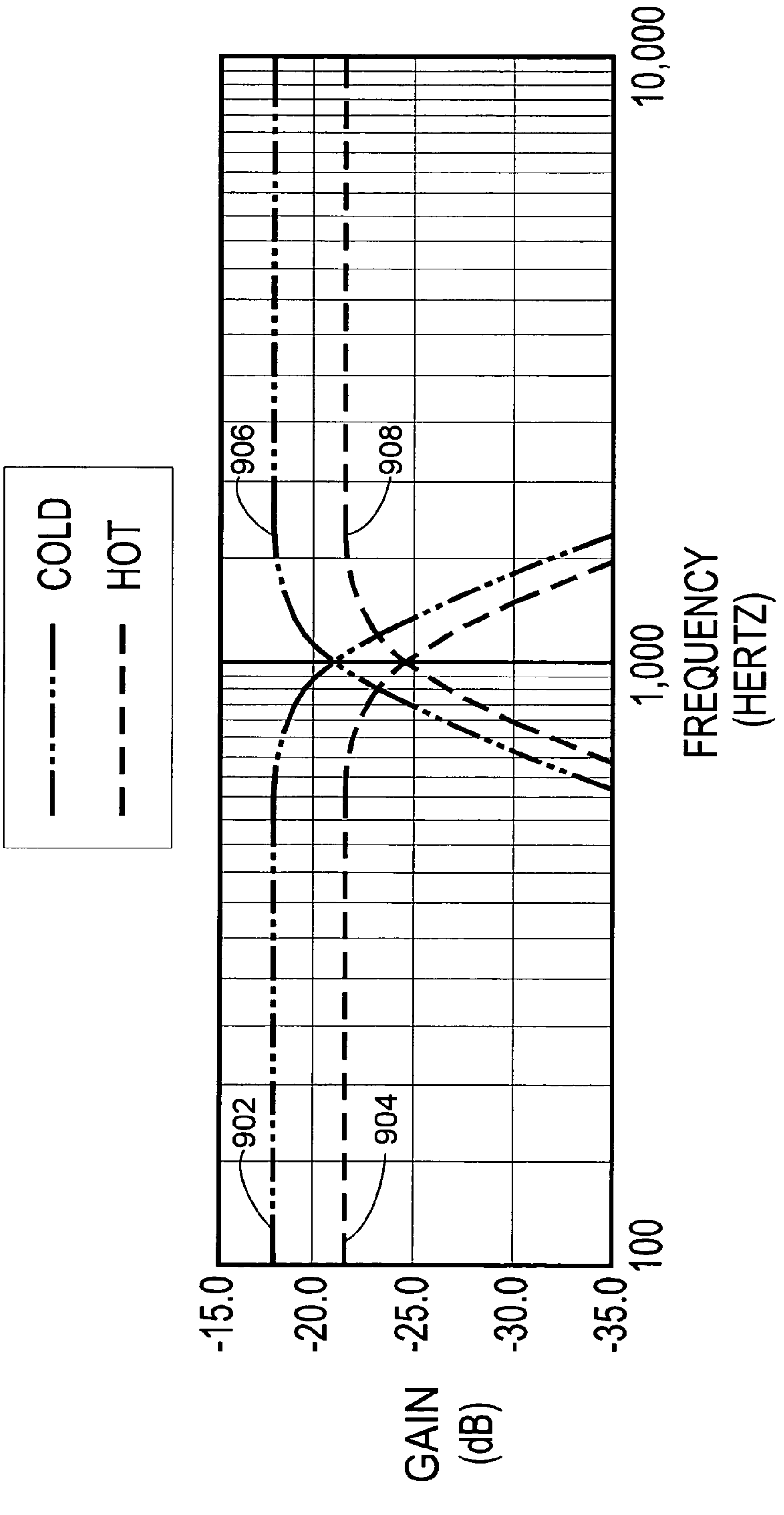
FIG. 9 is a frequency response graph for the speaker drivers of the example loudspeaker system of FIG. 1 using the example current-feedback amplifier of FIG. 4.

FIG. 9 is a frequency response graph for the speaker drivers 106 and 110 where the current-feedback amplifier 102 shown in FIG. 4 drives the driver circuit 114 shown in FIGS. 1-3. In this example, the power amplifier 102 has an output impedance about equal to the cold input impedance of the driver circuit 114. As shown in FIG. 9, in this example the hot frequency response plots 904 and 908 for the speaker drivers 106 and 110, respectively, are flat with respect to the cold frequency response plots 902 and 906.

Figure 10:
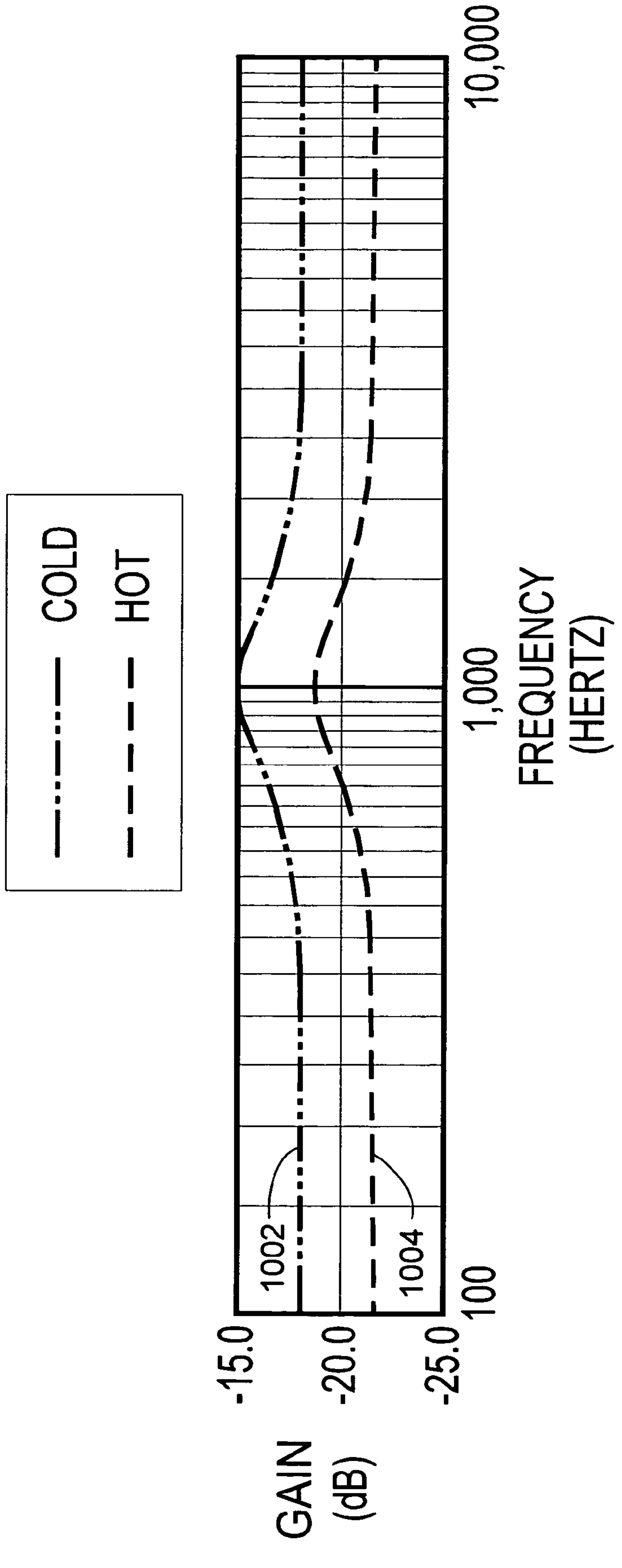
FIG. 10 is a combined frequency response graph for speaker drivers of the example loudspeaker system of FIG. 1 using the example current-feedback amplifier of FIG. 4.

The relative flatness between the hot frequency response plots 904 and 908 and the cold frequency response plots 902 and 906 is more clearly shown in FIG. 10. FIG. 10 includes a cold frequency response plot 1002 that is equal to the sum of the cold frequency response plots 902 and 906, and a hot frequency response plot 1004 that is equal to the sum of the hot frequency response plots 904 and 908. The hot frequency response plot 1004 for the loudspeaker system 100 is about 4.5 dB below the cold frequency response plot 1002 over the entire frequency range, including at the cutoff (crossover) frequency. Although not shown, a relative response plot that is equal to the hot frequency response plot 1004 divided by the cold frequency response plot 1002 (a relative frequency response similar to FIG. 8) is indeed a flat line at −4.5 dB from 100 Hz to 10,000 Hz.

As mentioned above, the output impedance $Z_o(s)$ of the power amplifier 102 may be designed to be more or less than the cold input impedance of the driver circuit 114. Other values for the output impedances $Z_o(s)$, such as 2 Ohms and 8 Ohms, also provide flatter relative frequency responses than a voltage-source amplifier provides. Where 2 Ohms is used for the output impedance $Z_o(s)$ of the power amplifier 102, however, the relative frequency response may be under compensated, resulting in a "valley" at the cutoff frequency with two adjacent "bumps" that are about 2 dB above the valley. This result, while not ideal, may still be significantly better than the relative frequency response shown in FIG. 8 that has a "valley" at the cutoff frequency with two adjacent "bumps" that are about 6 dB above the valley.

Where 8 Ohms is used for the output impedance $Z_o(s)$ of the power amplifier 102, the relative frequency response may be over compensated, resulting in a "bump" at the cutoff frequency with two adjacent "valleys" that are about 2 dB below the bump. Again, this result may not be ideal, but may still be significantly better than the relative frequency response shown in FIG. 8.

In conclusion, matching an output impedance of an amplifier to a cold input impedance of an arrangement of filters and speaker drivers that is coupled to the output of the amplifier compensates for frequency response changes that may result when the voice coils of the speaker drivers become heated. The loudspeaker system 100 is one such matched configuration that includes a current-feedback amplifier, two speaker drivers, and two fourth-order Butterworth filters. The loudspeaker system 100, however, could also comprise other types of filters, and/or more filters and speaker drivers.

For example, when using odd order filters, it may not be possible to obtain a completely flat relative frequency response by impedance matching alone. In such cases, it may be desirable to match the output impedance for the amplifier 102 to a "nominal working" input impedance of the driver circuit 114, which is somewhere between a hot and a cold input impedance, so that the hot and cold frequency responses are above and below the nominal frequency response.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A loudspeaker system for receiving an incoming electrical signal and transmitting an acoustical signal, the loudspeaker system comprising:

a driver circuit comprising a first passive filter coupled to a first speaker driver and a second passive filter coupled to a second speaker driver wherein a first filter impedance of the first passive filter is substantially matched to a first cold impedance of the first speaker driver, and a second filter impedance of the second passive filter is substantially matched to a second cold impedance of the second speaker driver; and a power amplifier having an input and an output, wherein the power amplifier includes a current-feedback amplifier configured to create a desired impedance at the output that is between about 25 percent and about 400 percent of a combined input impedance of the first filter impedance, the first cold impedance, the second filter impedance, and the second cold impedance the power amplifier comprising a current monitor operable to sense an output current at the output, and a feedback circuit coupled with the current monitor, the feedback circuit operable to generate a feedback signal to create the desired impedance at the output so that variations in frequency response as a result of impedance changes of the first speaker driver and the second speaker driver are minimized;

wherein the input of the power amplifier receives the incoming electrical signal, and the output of the power amplifier is coupled to the input of the driver circuit.

2. The loudspeaker system of claim 1, wherein the first passive filter comprises an inductor and a capacitor.

3. The loudspeaker system of claim 1, wherein the second passive filter comprises an inductor and a capacitor.

4. The loudspeaker system of claim 1, wherein the first passive filter comprises a Butterworth filter.

5. The loudspeaker system of claim 4, wherein the first passive filter comprises a fourth-order filter.

6. The loudspeaker system of claim 1, wherein the first filter impedance is an output characteristic termination impedance.

7. The loudspeaker system of claim 6, wherein the second filter impedance is an output characteristic termination impedance.

8. The loudspeaker system of claim 1, wherein the first cold impedance of about is 4 Ohms, the first filter impedance is an output characteristic termination impedance of about 4 Ohms, and the output impedance of the power amplifier is between about 1 Ohms and about 16 Ohms.

9. The loudspeaker system of claim 8, wherein the second cold impedance is about 4 Ohms, the second filter impedance is an output characteristic termination impedance of about 4 Ohms, and the output impedance of the power amplifier is between about 2 Ohms and about 8 Ohms.

10. The loudspeaker system of claim 1, wherein the first cold impedance is about 8 Ohms, the first filter impedance is an output characteristic termination impedance of about 8 Ohms, and the output impedance of the power amplifier is between about 2 Ohms and about 32 Ohms.

11. The loudspeaker system of claim 10, wherein the second cold impedance is about 8 Ohms, the second filter impedance is an output characteristic termination impedance of about 8 Ohms, and the output impedance of the power amplifier is between about 4 Ohms and about 16 Ohms.

12. The loudspeaker system of claim 1, further comprising an enclosure, wherein the driver circuit and the power amplifier are each affixed to the enclosure.

13. A method of constructing a loudspeaker system for receiving an incoming electrical signal and transmitting an acoustical signal, the method comprising:

selecting a first speaker driver having a first cold impedance;

selecting a second speaker driver having a second cold impedance;

constructing a first passive filter having an input an output; and a first filter impedance that is substantially matched to the first cold impedance;

constructing a second passive filter having an input an output; and a second filter impedance that is substantially matched to the second cold impedance;

coupling the output of the first passive filter to the first speaker driver so that the input of the first passive filter has a first combined cold impedance; comprising the first cold impedance and the first filter impedance;

coupling the output of the second passive filter to the second speaker driver so that the input of the second passive filter has a second combined cold impedance comprising the second cold impedance and the second filter impedance;

forming a passive arrangement of the first speaker driver, the second speaker driver, the first passive filter and the second passive filter by coupling the input of the first passive filter to the input of the second passive filter, where the passive arrangement has an arrangement cold impedance; comprising the first combined cold impedance and the second combined cold impedance;

constructing a power amplifier having an input for receiving said incoming electrical signal and an output, sensing a current on the output of the power amplifier with a current monitor;

setting an output impedance of the power amplifier with a current feedback circuit included in the power amplifier based on the sensed current, where the output impedance is set to be between about 25 percent and about 400 percent of the arrangement cold impedance to minimize changes in frequency response of the first speaker driver and the second speaker driver as the arrangement cold impedance varies; and coupling the output of the power amplifier to the input of the first passive filter and to the input of the second passive filter.

14. The method of claim 13, wherein constructing the first passive filter comprises coupling an inductor to a capacitor.

15. The method of claim 13, wherein constructing the second passive filter comprises coupling an inductor to a capacitor.

16. The method of claim 13, wherein constructing the first passive filter comprises constructing a Butterworth filter.

17. The method of claim 13, wherein selecting the first speaker driver comprises selecting a first speaker driver having a cold impedance of about 4 Ohms.

18. The method of claim 17, wherein constructing a power amplifier comprises constructing a power amplifier where the output has an output impedance that is between about 2 Ohms and about 8 Ohms.

19. The method of claim 13, wherein selecting the first speaker driver comprises selecting a first speaker driver having a cold impedance of about 8 Ohms.

20. The method of claim 19, wherein constructing a power amplifier comprises constructing a power amplifier where the output has an output impedance that is between about 2 Ohms and about 16 Ohms.

21. The method of claim 13, further comprising constructing an enclosure, and mounting the first and second passive filters, the first and second speaker drivers, and the power amplifier to the enclosure.

22. A loudspeaker system for receiving an incoming electrical signal and transmitting an acoustical signal, the loudspeaker system comprising:

an amplification means for receiving said incoming electrical signal at an input and providing an amplified signal that is a function of the incoming electrical signal at an output that has an output impedance;

a first filter means for receiving the amplified signal at an input and providing a first filtered signal that is a function of the amplified signal at an output; the first filter means comprising a first filter impedance a second filter means for receiving the amplified signal at an input and providing a second filtered signal that is a function of the amplified signal at an output; the second filter means comprising a second filter impedance a first speaker driver coupled to the output of the first filter means, where the first speaker driver has a first cold impedance that is substantially equal to the first filter impedance and is driven by the first filtered signal; and a second speaker driver coupled to the output of the second filter means, where the second speaker driver has a second cold impedance that is substantially equal to the second filter impedance and is driven by the second filtered signal;

where the amplification means comprises a current-feedback amplifier configured to set the output impedance of the amplification means to be between about 25 percent and about 400 percent of a combined impedance of the first cold impedance, the second cold impedance, the first filter impedance and the second filter impedance to minimize changes in frequency response of the first speaker driver and the second speaker driver as the respective first cold impedance and the second cold impedance changes, the amplification means further comprising a current monitoring means for monitoring current on the output, and a feedback means for generating a feedback signal to set the output impedance as a function of the monitored current.

23. The loudspeaker system of claim 22, wherein the current-feedback amplifier has an output impedance between about 2 Ohms and about 16 Ohms.

24. The loudspeaker system of claim 22, wherein the first filter impedance and the second filter impedance are each an output characteristic termination impedance.

25. A loudspeaker system for receiving an incoming electrical signal and transmitting an acoustical signal, the loudspeaker system comprising:

a driver circuit having an input impedance; the input impedance comprising a combination of a first cold impedance of a first speaker driver, a first filter impedance of a first filter coupled to the first speaker driver, a second cold impedance of a second speaker driver, and a second filter impedance of a second filter coupled to the second speaker driver, wherein the first filter impedance is substantially equal to the first cold impedance, and the second filter impedance is substantially equal to the second cold impedance a current feedback amplifier comprising a current monitor and a feedback circuit, where the current monitor is operable to sense a current at an output of the current feedback amplifier and the feedback circuit is operable as a function of the sensed current to generate a feedback signal to create an output impedance of the current feedback amplifier that is substantially matched to the input impedance of the driver circuit so that variation in a frequency response of the driver circuit is minimized as increases in an operational temperature of the driver circuit causes increases in the input impedance.

26. A method of operating a loudspeaker system that converts an incoming electrical signal to an acoustical signal, the method comprising:

operating a driver circuit in a temperature range so that an input impedance of the driver circuit is in an operational range; the input impedance comprising a combination of a first cold impedance of a first speaker driver, a first filter impedance of a first filter coupled to the first speaker driver, a second cold impedance of a second speaker driver, and a second filter impedance of a second filter coupled to the second speaker driver, wherein the first filter impedance is substantially equal to the first cold impedance, and the second filter impedance is substantially equal to the second cold impedance configuring an output impedance of a current-feedback amplifier with a feedback signal, to be within the operational range of the input impedance of the driver circuit, generating the feedback signal based on an output current of the current-feedback amplifier that is being monitored with a current monitor to minimize frequency response variation of the driver circuit as the input impedance changes within the operational range;

amplifying the incoming electrical signal with the current-feedback amplifier to produce a driving electrical signal; and driving the driver circuit with the driving electrical signal.

27. The loudspeaker system of claim 1, where the power amplifier includes a summer configured to sum the incoming electrical signal and the feedback signal to form the desired impedance at the output.

28. The loudspeaker system of claim 1, where the feedback circuit is configured with a transfer ratio that is the same as the desired impedance.

29. The method of claim 13, where selling an output impedance of the power amplifier with a current feedback circuit comprises summing the incoming electrical signal with a feedback signal generated by the feedback circuit to create the output impedance.

30. The loudspeaker system of claim 22, where the current-feedback amplifier comprises a summer operable to sum the incoming electrical signal and the feedback signal to set the output impedance.

31. The method of claim 26, where amplifying the incoming electrical signal comprises summing the feedback signal and the incoming electrical signal to produce the driving electrical signal.

32. The loudspeaker system of claim 25, further comprising a speaker enclosure housing the driver circuit and the current feedback amplifier.

33. The loudspeaker system of claim 25, where the current feedback amplifier is operable to receive the incoming electrical signal and drive the driver circuit.

34. The loudspeaker system of claim 1, where the impedance changes are a result of heating of the first loudspeaker driver and the second loudspeaker driver, and the current-feedback amplifier is configured to adjust the desired impedance at the output based on the feedback signal to minimize the effect of the heating.

35. The loudspeaker system of claim 1, where the feedback circuit is operable to control the current-feedback amplifier to create the desired impedance at the output based on the output current sensed at the output.

36. The method of claim 13, where setting an output impedance of the power amplifier comprises minimizing the effect of changes in the first cold impedance and the second cold impedance due to respective heating of the first loudspeaker driver and the second loudspeaker driver.

37. The method of claim 13, where setting an output impedance of the power amplifier comprises controlling the output impedance of the power amplifier based on the sensed current.

38. The loudspeaker system of claim 22, where the changes of the first cold impedance and the second cold impedance are a result of heating of the first speaker driver and the second speaker driver, and the output impedance is set with the current-feedback amplifier to minimize the effect of the heating.

39. The loudspeaker system of claim 22, where the feedback means is operable to generate the feedback signal to control the output impedance based on the monitored current.

40. The loudspeaker system of claim 25, where variation in the cold input impedance is a result of heating of the driver circuit, and the output impedance of the current feedback amplifier is set based on the feedback signal to minimize the effect of the heating.

41. The loudspeaker system of claim 25, where the feedback circuit is operable to generate the feedback signal to control the output impedance of the current feedback amplifier based on the sensed current.

42. The method of claim 26, where generating the feedback signal comprises minimizing the effect of changes in the input impedance of the driver circuit due to heating of the first speaker driver and the second speaker driver included in the driver circuit.

43. The method of claim 26, where generating the feedback signal comprises controlling the output impedance of the current-feedback amplifier based on the monitored output current.

* * * * *

UNITED STATES PATENT AND TRADEMARK OFFICE

CERTIFICATE OF CORRECTION

PATENT NO. : 7,321,661 B2
APPLICATION NO. : 10/697626
DATED : January 22, 2008
INVENTOR(S) : Gerald R. Stanley It is certified that error appears in the above-identified patent and that said Letters Patent is hereby corrected as shown below:

Column 1
Item 75, delete “Osccola” and insert --Osceola--.

Column 9
Line 23, add “,” after “impedance”.
Line 34, delete “input of the” between “the” and “driver”.
Line 50, delete “of about is 4 Ohms” and insert --is about 4 Ohms--.

Column 10
Line 13, add “,” after “input” and before “an”.
Line 14, delete “;” and insert --,--.
Line 16, add “,” after “input” and before “an”.
Line 17, delete “;” after “output” and insert --,--.
Line 21, delete “;” after “impedance” and before “comprising”.
Line 33, delete “;” after “impedance” and before “comprising”.

Column 11
Line 18, delete “;” after “output” and insert --,--.
Line 19, add “;” after “impedance”.
Line 23, add “;” after “impedance”.
Line 58, delete “;” and insert --,--.
Line 66, insert “;” after “impedance”.

UNITED STATES PATENT AND TRADEMARK OFFICE

CERTIFICATE OF CORRECTION

PATENT NO. : 7,321,661 B2
APPLICATION NO. : 10/697626
DATED : January 22, 2008
INVENTOR(S) : Gerald R. Stanley It is certified that error appears in the above-identified patent and that said Letters Patent is hereby corrected as shown below:

Column 12
Line 18, delete ";" and insert --,--.
Line 27, insert ";" after "ance".
Line 48, delete "selling" and insert --setting--.

Signed and Sealed this

Sixth Day of May, 2008

JON W. DUDAS
*Director of the United States Patent and Trademark Office*